United States Patent
Wang et al.

(10) Patent No.: US 9,219,110 B2
(45) Date of Patent: Dec. 22, 2015

(54) MIM CAPACITOR STRUCTURE

(71) Applicant: Taiwan Semiconductor Manufacturing Co., Ltd., Hsin-Chu (TW)

(72) Inventors: Chien-Chung Wang, New Taipei (TW); Wei-Min Tseng, New Taipei (TW); Shih-Guo Shen, New Taipei (TW); Huey-Chi Chu, Hsin-Chu (TW); Wen-Chuan Chiang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/249,482

(22) Filed: Apr. 10, 2014

(65) Prior Publication Data

US 2015/0295019 A1    Oct. 15, 2015

(51) Int. Cl.
| | | |
|---|---|---|
| *H01L 27/108* | (2006.01) | |
| *H01L 29/94* | (2006.01) | |
| *H01L 49/02* | (2006.01) | |
| *H01L 21/768* | (2006.01) | |
| *H01L 23/58* | (2006.01) | |
| *H01L 21/02* | (2006.01) | |
| *H01L 21/28* | (2006.01) | |

(52) U.S. Cl.
CPC .......... *H01L 28/75* (2013.01); *H01L 21/02304* (2013.01); *H01L 21/28123* (2013.01); *H01L 21/76877* (2013.01); *H01L 23/585* (2013.01)

(58) Field of Classification Search
None
See application file for complete search history.

(56) References Cited

U.S. PATENT DOCUMENTS

| | | | |
|---|---|---|---|
| 5,541,428 A | 7/1996 | Nagatomo | |
| 5,903,023 A | 5/1999 | Hoshi | |
| 5,977,582 A | 11/1999 | Fleming et al. | |
| 6,046,467 A | 4/2000 | Arita et al. | |
| 6,115,233 A | 9/2000 | Seliskar et al. | |
| 6,227,211 B1 | 5/2001 | Yang et al. | |
| 6,281,134 B1 | 8/2001 | Yeh et al. | |
| 6,720,232 B1 | 4/2004 | Tu et al. | |
| 6,919,244 B1 | 7/2005 | Remmel et al. | |
| 7,956,400 B2 * | 6/2011 | Smith ........................... | 257/306 |
| 8,298,875 B1 | 10/2012 | Or-Bach et al. | |
| 8,753,953 B1 | 6/2014 | Cheng et al. | |
| 2001/0046737 A1 | 11/2001 | Ahn et al. | |

(Continued)

OTHER PUBLICATIONS

Non Final Office Action Dated May 22, 2015 U.S. Appl. No. 14/249,513.

(Continued)

*Primary Examiner* — Sonya D McCall Shepard
(74) *Attorney, Agent, or Firm* — Eschweiler & Associates, LLC

(57) ABSTRACT

The present disclosure relates to a MIM capacitor, and an associated method of formation. In some embodiments, the MIM capacitor has a first electrode having a bottom capacitor metal layer disposed over a semiconductor substrate. A second electrode having a middle capacitor metal layer overlies the bottom capacitor metal layer. A third electrode having a top capacitor metal layer has a stepped structure is laterally and vertically separated from the middle capacitor metal layer by a capacitor dielectric layer continuously extends from a first position between the bottom capacitor metal layer and the middle capacitor metal layer, to a second position between the middle capacitor metal layer and the top capacitor metal layer. The capacitor dielectric layer allows for the MIM capacitor to have a structure that improves fabrication of the capacitor.

20 Claims, 3 Drawing Sheets

(56) References Cited

U.S. PATENT DOCUMENTS

| | | |
|---|---|---|
| 2002/0094656 A1 | 7/2002 | Armacost et al. |
| 2003/0049885 A1 | 3/2003 | Iijima et al. |
| 2003/0178665 A1 | 9/2003 | Takenaka |
| 2003/0178666 A1 | 9/2003 | Lee et al. |
| 2004/0061177 A1 | 4/2004 | Merchant et al. |
| 2004/0140527 A1 | 7/2004 | Furuya et al. |
| 2004/0180530 A1 | 9/2004 | Li et al. |
| 2005/0062130 A1 | 3/2005 | Ciancio et al. |
| 2005/0170583 A1 | 8/2005 | Park |
| 2005/0205913 A1 | 9/2005 | Yaegashi |
| 2006/0145293 A1 | 7/2006 | Cho |
| 2007/0045702 A1 | 3/2007 | Liang |
| 2007/0200162 A1 | 8/2007 | Tu et al. |
| 2008/0055816 A1 | 3/2008 | Park et al. |
| 2008/0061345 A1 | 3/2008 | Wang |
| 2008/0217775 A1 | 9/2008 | Pai et al. |
| 2008/0290459 A1 | 11/2008 | Barth et al. |
| 2009/0008743 A1 | 1/2009 | Lee et al. |
| 2009/0014835 A1 | 1/2009 | Furumiya et al. |
| 2009/0134493 A1 | 5/2009 | Iwaki |
| 2009/0200638 A1 | 8/2009 | Smith |
| 2010/0065944 A1 | 3/2010 | Tu et al. |
| 2010/0079929 A1 | 4/2010 | Smeys et al. |
| 2010/0127350 A1 | 5/2010 | Totsuka |
| 2010/0164669 A1 | 7/2010 | Soendker et al. |
| 2010/0213572 A1 | 8/2010 | Ching et al. |
| 2010/0270643 A1 | 10/2010 | Iwaki |
| 2010/0289108 A1 | 11/2010 | Meinel et al. |
| 2010/0301451 A1 | 12/2010 | Iwaki |
| 2011/0303284 A1 | 12/2011 | Kim et al. |
| 2012/0091559 A1 | 4/2012 | Tu et al. |
| 2012/0181657 A1 | 7/2012 | Wu et al. |
| 2012/0199946 A1 | 8/2012 | Kageyama |
| 2012/0319239 A1 | 12/2012 | Chang et al. |
| 2013/0020678 A1 | 1/2013 | Tu et al. |
| 2013/0193556 A1 | 8/2013 | Lee et al. |
| 2013/0270675 A1 | 10/2013 | Childs et al. |
| 2013/0277680 A1 | 10/2013 | Green et al. |
| 2013/0285203 A1 | 10/2013 | Hiroi et al. |
| 2013/0292794 A1 | 11/2013 | Pai et al. |
| 2013/0300003 A1 | 11/2013 | Sun et al. |
| 2013/0320493 A1 | 12/2013 | Chang et al. |
| 2014/0159200 A1 | 6/2014 | Loke et al. |
| 2014/0291805 A1 | 10/2014 | Hong |
| 2015/0028408 A1 | 1/2015 | Meiser et al. |
| 2015/0048483 A1 | 2/2015 | Kuo et al. |
| 2015/0108605 A1 | 4/2015 | Park et al. |
| 2015/0115408 A1 | 4/2015 | Sun et al. |

OTHER PUBLICATIONS

U.S. Appl. No. 14/289,739, filed May 29, 2014.
U.S. Appl. No. 14/249,498, filed Apr. 10, 2014.
U.S. Appl. No. 14/249,513, filed Apr. 10, 2014.
Non Final Office Action Dated Jul. 14, 2015 U.S. Appl. No. 14/289,739.
Final Office Action Dated Aug. 28, 2015 U.S. Appl. No. 14/249,513.

* cited by examiner

MIM CAPACITOR STRUCTURE

BACKGROUND

Integrated chips are formed on semiconductor die comprising millions or billions of transistor devices. The transistor devices are configured to act as switches and/or to produce power gains so as to enable logical functionality for an integrated chip (e.g., form a processor configured to perform logic functions). Integrated chips often also comprise passive devices, such as capacitors, resistors, inductors, varactors, etc. Passive devices are widely used to control integrated chip characteristics (e.g., gain, time constants, etc.) and to provide an integrated chip with a wide range of different functionalities (e.g., manufacturing analog and digital circuitry on the same die).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
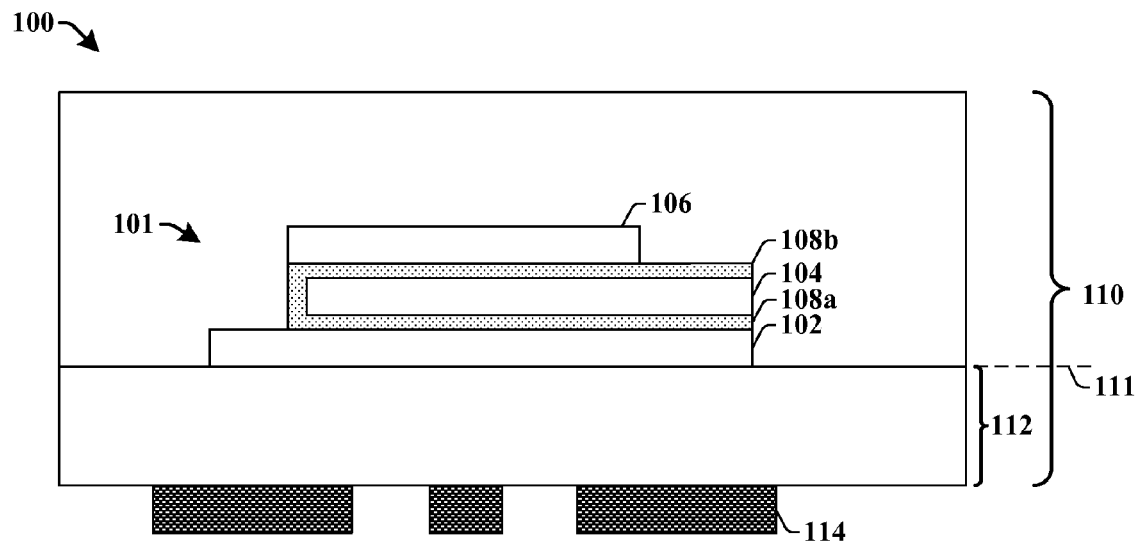
FIG. 1 illustrates a cross-sectional view of some embodiments of an integrated chip having a MIM (metal-insulator-metal) capacitor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MIM (metal-insulator-metal) capacitors are a particular type of capacitor, having a top metal plate and a bottom metal plate separated by a capacitor dielectric, which are often implemented in integrated circuits. MIM capacitors can be used as decoupling capacitors configured to mitigate power supply or switching noise caused by changes in current flowing through various parasitic inductances associated with an integrated chip and a package in which the integrated chip is located. For example, simultaneous switching of the input/output (I/O) and core circuits within an integrated chip can cause a voltage drop on a power supply source by an amount proportional to the inductance of a power bus. This power supply noise may increase signal delay, thereby reducing the operating frequency of a system-on-a-chip (SoC), and inadvertently cause state transitions in logic circuits within the SoC.

MIM capacitors are often integrated into back-end-of-the-line (BEOL) metallization stack, at a position that is vertically disposed between an underlying first metal layer and an overlying second metal layer. However, positioning a MIM capacitor within a BEOL metallization stack can present a number of fabrication problems. For example, MIM capacitors typically have a large number of layers that lead to a topography (e.g., having a step size of more than 400 nm) which is greater than most BOEL metallization layers. Furthermore, metal interconnect layers are not permitted since hillocks, or spike like projections, from such 'under-metal layers' may cause electrical shorting between the under-metal layers and the MIM capacitor.

The present disclosure relates to a MIM capacitor, and an associated method of formation. In some embodiments, the MIM capacitor comprises a first electrode having a bottom capacitor metal layer disposed over a semiconductor substrate. A second electrode comprising a middle capacitor metal layer overlies the bottom capacitor metal layer. A third electrode comprising a top capacitor metal layer has a stepped structure is laterally and vertically separated from the middle capacitor metal layer by a capacitor dielectric layer that continuously extends from a first position between the bottom capacitor metal layer and the middle capacitor metal layer, to a second position between the middle capacitor metal layer and the top capacitor metal layer. The capacitor dielectric layer allows for the MIM capacitor to have a structure that improves fabrication of the capacitor.

FIG. 1 illustrates a cross-sectional view of some embodiments of an integrated chip 100 having a MIM (metal-insulator-metal) capacitor 101.

The MIM capacitor 101 comprises a bottom electrode comprising a bottom capacitor metal layer 102, a middle electrode comprising a middle capacitor metal layer 104, and a top electrode comprising a top capacitor metal layer 106. A capacitor dielectric layer 108 is configured to electrically separate the bottom, middle and top capacitor metal layers, 102-106, from one another, so that the MIM capacitor 101 is able to store energy in an electric field generated between the electrodes. In some embodiments, the capacitor dielectric layer 108 may comprise a high-k dielectric material (i.e., a dielectric material having a dielectric constant greater than silicon dioxide).

In some embodiments, the capacitor dielectric layer 108 continuously extends from a first position between the bottom capacitor metal layer 102 and the middle capacitor metal layer 104 to a second position between the middle capacitor metal layer 104 and the top capacitor metal layer 106. For example, in some embodiments, the capacitor dielectric layer 108 comprises a lower section 108a and an upper section 108b connected by way of a vertical connection abutting a sidewall of the middle capacitor metal layer 104. The lower section 108a of the capacitor dielectric layer 108 is disposed onto the bottom capacitor metal layer 102 and is configured to separate the bottom capacitor metal layer 102 from the middle capacitor metal layer 104. The upper section 108a of the capacitor dielectric layer 108 is disposed onto the middle capacitor metal layer 104 and is configured to separate the middle capacitor metal layer 104 from the top capacitor metal layer 106.

The MIM capacitor 101 is disposed within a capacitor inter-level dielectric (ILD) layer 110. In various embodiments, the capacitor ILD layer 110 may comprise one or more dielectric materials (e.g., low-k dielectric material, oxide material, etc.). In some embodiments, the capacitor ILD layer 110 extends below a bottom surface of the MIM capacitor (line 111) as a dielectric buffer layer 112. An under-metal layer 114 comprising one or more metal structures is disposed under the MIM capacitor 101 at a position below the dielectric buffer layer 112. By separating the bottom capacitor metal layer 102 from the under-metal layer 114, the dielectric buffer layer 112 is configured to prevent hillocks (i.e., hill-like or spike-like projections) from the under-metal layer 114 from interfering with the MIM capacitor 101. Furthermore, by isolating the MIM capacitor 101 from under-metal layer 114 the dielectric buffer layer 112 also prevents the MIM capacitor 101 from introducing a parasitic capacitance into the under-metal layer 114.

Figure 2:
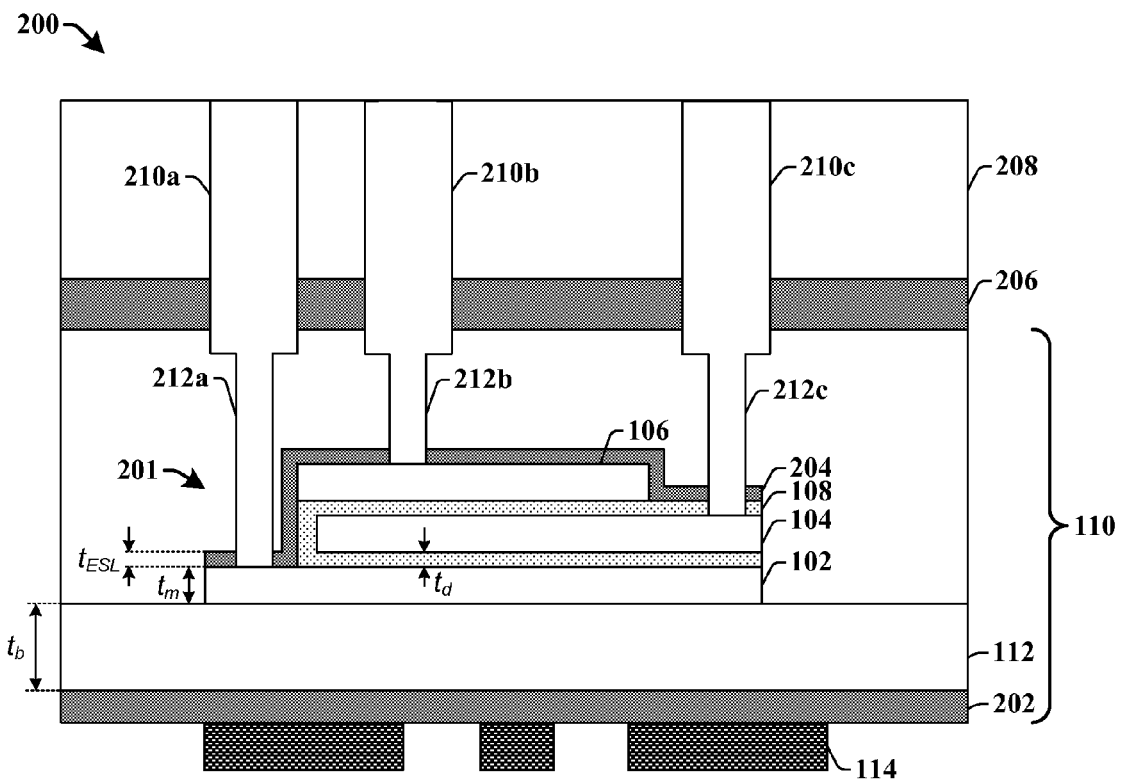
FIG. 2 illustrates a cross-sectional view of some additional embodiments of an integrated chip having a MIM capacitor.

FIG. 2 illustrates a cross-sectional view of some embodiments of an integrated chip 200 having a MIM capacitor 201.

The MIM capacitor 201 comprises a bottom capacitor metal layer 102, a middle capacitor metal layer 104, and a top capacitor metal layer 106. In some embodiments, the capacitor metal layers 102-106 may have a thickness $t_m$ in a range of between approximately 100 angstroms and approximately 800 angstroms. In various embodiments, the capacitor metal layers 102-106 may comprise various conductive materials, such as indium tin oxide (ITO), aluminum (Al), titanium (Ti), titanium nitride (TiN), tantalum (Ta), tantalum nitride (TaN), tungsten (W), tungsten nitride (WN), molybdenum nitride (MoN), copper (Cu), platinum (Pt), palladium (Pd), osmium (Os), ruthenium (Ru), iridium oxide ($IrO_2$), rhenium oxide ($ReO_2$), rhenium trioxide ($ReO_3$), or a combination thereof.

A capacitor dielectric layer 108 is disposed between the capacitor metal layers 102-106. In some embodiments, the capacitor dielectric layer 108 may have a thickness $t_d$ in a range of between approximately 20 angstroms and approximately 200 angstroms. In some embodiments, the capacitor dielectric layer 108 may comprise a single layer. In other embodiments, capacitor dielectric layer 108 may comprise a complex layer comprising one or more of silicon dioxide ($SiO_2$), silicon nitride ($Si_3N_4$), aluminum oxide ($Al_2O_3$), tantalum oxide ($Ta_2O_5$), titanium oxide ($TiO_2$), strontium titanate ($SrTiO_3$), zirconium oxide ($ZrO_2$), hafnium oxide ($HfO_2$), hafnium silicate ($HfSiO_4$), lanthanum oxide ($La_2O_3$), yttrium oxide ($Y_2O_3$), etc.

The integrated chip 200 further comprises a lower etch stop layer 202 disposed onto an under-metal layer 114. The lower etch stop layer 202 is separated from the MIM capacitor 201 by dielectric buffer layer 112. In various embodiments, the dielectric buffer layer 112 may have a thickness $t_b$ that is in a range of between approximately 5% and approximately 50% of the thickness of the capacitor ILD layer 110.

A capacitor etch stop layer 204 is disposed over the MIM capacitor 201 at a position that is between the top capacitor metal layer 106 and a capacitor ILD layer 110. The capacitor etch stop layer 204 comprises a stepped structure having a variable vertical position. In various embodiments, the capacitor etch stop layer 204 may have a thickness $t_{ESL}$ that is in a range of between approximately 100 angstroms and approximately 2000 angstroms.

A planar etch stop layer 206 is disposed over the capacitor ILD layer 110. The planar etch stop layer 206 has a planar surface that extends over the MIM capacitor 201. The planar surface is parallel to a top surface of an underlying semiconductor substrate (not shown). A metal ILD layer 208 is disposed over the planar etch stop layer 206. The metal ILD layer 208 has a metal interconnect layer 210 comprising a conductive material (e.g., copper) that is configured to convey electrical signals. The metal interconnect layer 210 may comprise a metal wire layer configured to provide for lateral connections.

A plurality of vias 212 are configured to connect the metal interconnect layer 210 to the MIM capacitor 201. The plurality of vias 212 are coupled to the metal interconnect layer 210 and provide for vertical connections to the different capacitor metal layers 102-106. For example, a first via 212a is configured to provide for a vertical connection between the metal interconnect layer 210 and the bottom capacitor metal layer 102. A second via 212b is configured to provide for a vertical connection between the metal interconnect layer 210 and the top capacitor metal layer 106. A third via 212c is configured to provide for a vertical connection between the metal interconnect layer 210 and the middle capacitor metal layer 104.

Figure 3:
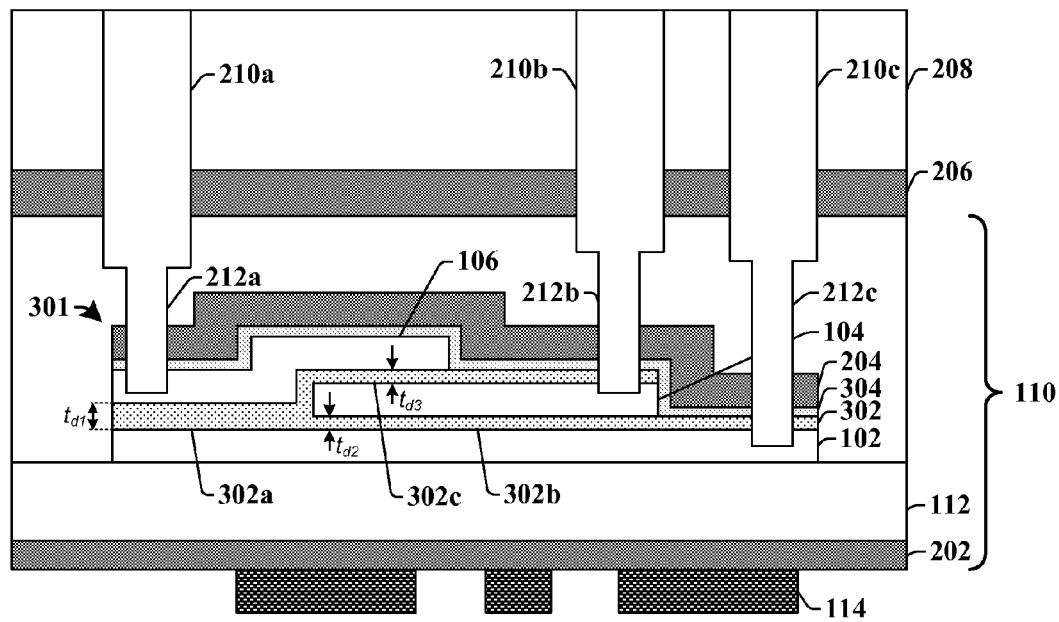
FIG. 3 illustrates a cross-sectional view of some additional embodiments of an integrated chip having a MIM capacitor having a multi-pronged capacitor dielectric layer.

FIG. 3 illustrates a cross-sectional view of some embodiments of an integrated chip 300 having a MIM capacitor 301 having a multi-pronged capacitor dielectric layer 302.

The multi-pronged capacitor dielectric layer 302 is disposed between a bottom capacitor metal layer 102, a middle capacitor metal layer 104, and a top capacitor metal layer 106. The multi-pronged capacitor dielectric layer 302 branches out from a main branch 302a to a lower branch 302b and an upper branch 302c. The main branch 302a is disposed between the bottom capacitor metal layer 102 and the top capacitor metal layer 106, the lower branch 302b is disposed between bottom capacitor metal layer 102 and the middle capacitor metal layer 104, and the upper branch 302c is disposed between middle capacitor metal layer 104 and the top capacitor metal layer 106. In some embodiments, a thickness of the multi-pronged dielectric layer 302 varies a function of position. For example, in some embodiments, main branch 302a of the multi-pronged capacitor dielectric layer 302 may have a first thickness $t_{d1}$, while the lower and upper branches, 302b and 302c, may have thicknesses $t_{d2}$ and $t_{d3}$ less than the first thickness $t_{d1}$.

The different thicknesses of the multi-pronged capacitor dielectric layer 302 allow for MIM capacitor 301 to provide for different capacitive values. For example, by routing signals to different capacitor metal layers, MIM capacitor 301 can have different capacitive values and therefore can be used for different purposes. In some embodiments, connecting the top capacitor metal layer 106 to a first voltage (e.g., $V_{DD}$) and the middle capacitor metal layer 104 to a second voltage (e.g., $V_{SS}$) larger than the first voltage will allow capacitor 301 to provide for an I/O connection. In other embodiments, connecting the bottom capacitor metal layer 102 to a first voltage (e.g., $V_{DD}$) and the middle capacitor metal layer 104 to a second voltage (e.g., $V_{SS}$) larger than the first voltage will allow capacitor 301 to provide for a core connection. In yet other embodiments, connecting the bottom capacitor metal layer 102 to a first voltage (e.g., $V_{DD}$) and the top capacitor metal layer 106 to a second voltage (e.g., $V_{SS}$) larger than the first voltage will provide a series connection that provides for yet another capacitance value.

In some embodiments, the main branch 302a of the multi-pronged capacitor dielectric layer 302 extends outward from the upper branch 302c to a position beyond the middle capacitor metal layer 104 in a manner that causes the multi-pronged capacitor dielectric layer 302 to have a stepped structure. The top capacitor metal layer 106 is disposed onto the main branch 302a and the upper branch 302c of the multi-pronged dielectric layer 302, so that the top capacitor metal layer 106 also comprises a stepped structure, which is both laterally disposed from the middle capacitor metal layer 104 and vertically disposed above the middle capacitor metal layer 104.

Typically, the stacked electrode structure of a MIM capacitor has topography differences between capacitor metal layers that make it difficult to form vias (e.g., since more of the capacitor ILD layer 110 is etched to reach the bottom capacitor metal layer 102 than to reach the top capacitor metal layer 106). However, the stepped structure of the top capacitor metal layer 106 provides for a simplification of the fabrication of the plurality of vias 212. This is because the stepped structure reduces topographical differences between the top capacitor metal layer 106 and the middle capacitor metal layer 104, thereby mitigating etching differences between the vias 212a and 212b. In some embodiments, the middle capacitor metal layer 104 and/or the bottom capacitor metal layer 102 may also comprise stepped structures that further mitigate the etching differences between associated vias (e.g., bottom capacitor metal layer 102 may comprise a stepped structure that causes the bottom capacitor metal layer 102 to have a section that is vertically aligned with a section of the middle capacitor metal layer 104).

In some embodiments, a cap layer 304 is disposed over the MIM capacitor 301. The cap layer 304 may comprise a stepped structure that is disposed onto the top capacitor metal layer 106, the upper branch 302c of the multi-pronged capacitor dielectric layer 302, and the lower branch 302b of the multi-pronged capacitor dielectric layer 302. The cap layer 304 is configured to prevent interaction between adjacent layers (e.g., to prevent diffusion from the capacitor metal layers to an adjacent dielectric material or to protect underlying layers from further processing). In various embodiments, the cap layer 304 may comprise a conductive cap layer or a dielectric cap layer. A capacitor etch stop layer 204 may be disposed onto the cap layer 304 at a position that is between the cap layer 304 and the capacitor ILD layer 110.

Figure 4:
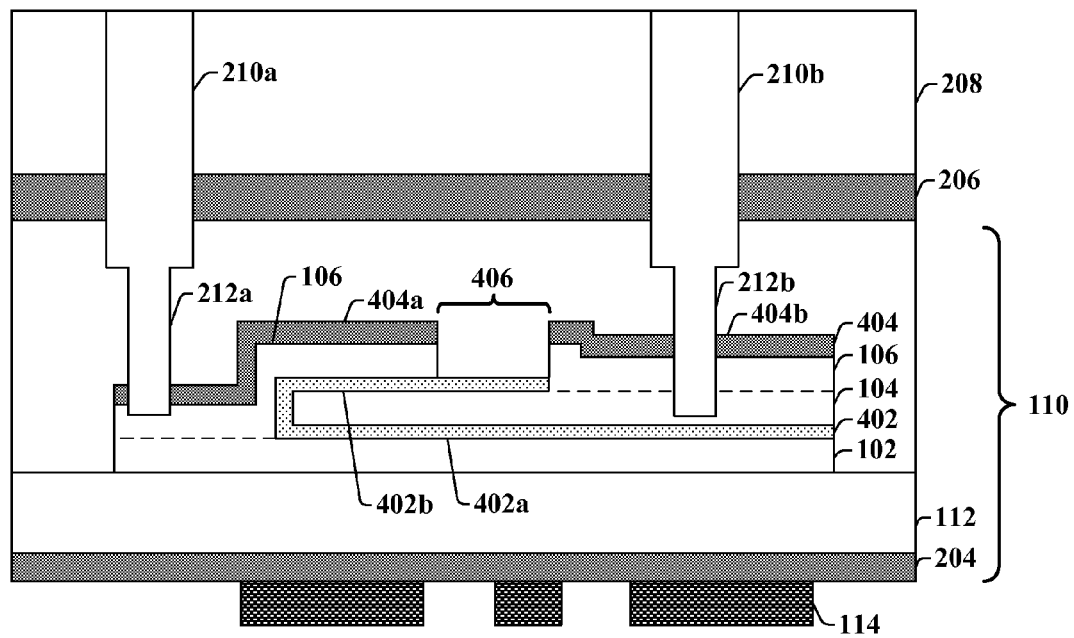
FIG. 4 illustrates a cross-sectional view of some additional embodiments of an integrated chip having a MIM capacitor having three electrodes connected to two vias.

FIG. 4 illustrates a cross-sectional view of some embodiments of an integrated chip 400 having a MIM capacitor 401 having three electrodes connected to two vias.

MIM capacitor 401 comprises a bottom capacitor metal layer 102 disposed over a dielectric buffer layer 112, a middle capacitor metal layer 104 disposed over the bottom capacitor metal layer 102, and a top capacitor metal layer 106 disposed over the middle capacitor metal layer 104. The bottom capacitor metal layer 102 is electrically connected to a top capacitor metal layer 106, and the middle capacitor metal layer 104 is electrically connected to the top capacitor metal layer 106. A capacitor dielectric layer 402 is disposed between the bottom capacitor metal layer 102, the middle capacitor metal layer 104, and the top capacitor metal layer 106. In some embodiments, the capacitor dielectric layer 402 is continuous but split up into sections 402a and 402b. The section 402a of capacitor dielectric layer covers a portion of the bottom capacitor metal layer 102, and section 402b of the capacitor dielectric layer covers a portion of the middle capacitor metal layer 104. In some embodiments, the capacitor dielectric layer 402 has a 'U' shaped containing a portion of the middle capacitor metal layer 104.

A capacitor etch stop layer 404 is disposed onto the top capacitor metal layer 106. The capacitor etch stop layer 404 is discontinuous, so that it comprises a first portion 404a and a second portion 404b separated by a space 406.

A first via 212a vertically extends through a planar etch stop layer 206 and the capacitor ILD layer 110 to a first position that is electrically coupled to the bottom capacitor metal layer 102 and the top capacitor metal layer 106. A second via 212b vertically extends through the planar etch stop layer 206 and the capacitor ILD layer 110 to a second position that is electrically coupled to the middle capacitor metal layer 104 and the top capacitor metal layer 106. By connecting the first via 212a to the bottom capacitor metal layer 102 and the top capacitor metal layer 106, the three plate MIM capacitor 401 can be operated using two via connections.

Figure 5:
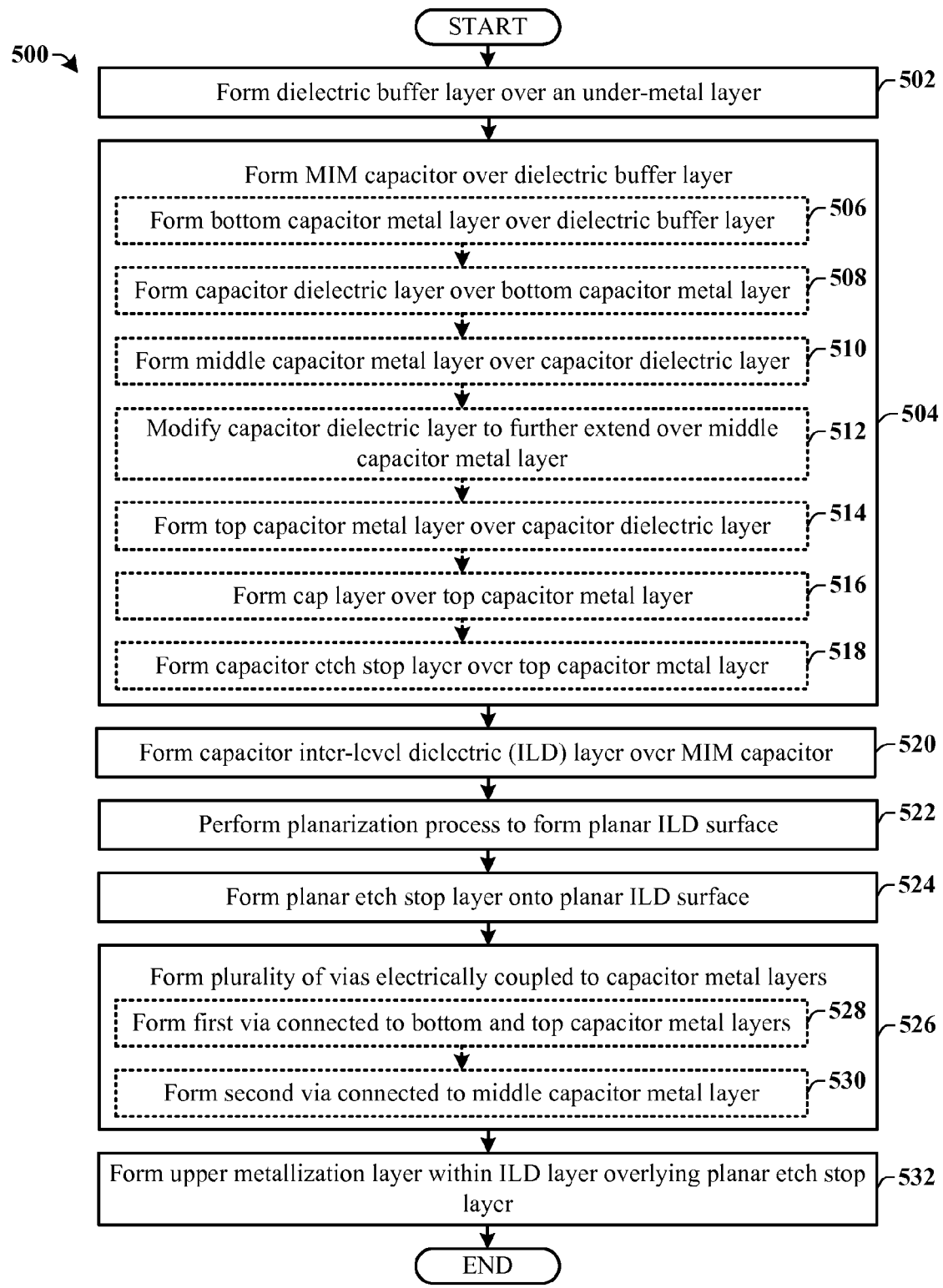
FIG. 5 illustrates a flow diagram of some embodiments of a method of forming an integrated chip comprising a MIM capacitor.

FIG. 5 illustrates a flow diagram of some embodiments of a method 500 of forming an integrated chip comprising a MIM capacitor.

While method 500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, a dielectric buffer layer is formed over an under-metal layer. The under-metal layer comprises a metal interconnect layer within a back-end-of-the-line (BEOL) stack of an integrated chip.

At 504, a MIM (metal-insulator-metal) capacitor is formed over the dielectric buffer layer. In some embodiments, the MIM capacitor may be formed according to acts 506-518.

At 506, a bottom capacitor metal layer is formed over the buffer dielectric layer. The bottom capacitor metal layer is disposed over one or more structures of the under-metal layer. In some embodiments, the bottom capacitor metal layer may be formed onto and in direct contact with the dielectric buffer layer.

At 508, a capacitor dielectric layer is formed over the bottom capacitor metal layer.

At 510, a middle capacitor metal layer is formed over the capacitor dielectric layer.

At 512, the capacitor dielectric layer is modified to extend over the middle capacitor metal layer. In some embodiments, the capacitor dielectric layer may be modified to connect a dielectric layer below the middle capacitor metal layer with a dielectric layer above the middle capacitor metal layer by way of a vertical connection abutting a sidewall of the middle capacitor metal layer. In some embodiments, modifying the capacitor dielectric layer may result in a capacitor dielectric layer having a thickness that varies as a function of position.

At 514, a top capacitor metal layer is formed over the capacitor dielectric layer. In some embodiments, the top capacitor metal layer comprises a stepped structure formed at a position that is laterally and vertically separated from the middle capacitor metal layer by the capacitor dielectric layer.

At 516, a cap layer may be formed over the top capacitor metal layer. In some embodiments, the cap layer may be formed onto the top capacitor metal layer and capacitor dielectric layer.

At 518, a capacitor etch stop layer may be formed over the top capacitor metal layer. In some embodiments, the capacitor etch stop layer may be formed at a position that vertically extends from a first position over the top capacitor metal layer to a second position over the middle capacitor metal layer.

At 520, a capacitor inter-level dielectric (ILD) layer comprising an insulating dielectric material is formed over the MIM capacitor.

At 522, a planarization process is performed to remove a portion of the capacitor ILD layer and to form a planar capacitor ILD surface overlying the MIM capacitor.

At 524, a planar etch stop layer is formed over the capacitor ILD layer. In some embodiments, the planar etch stop layer is formed by performing a planarization process on the capacitor ILD layer to form a substantially planar surface. The planar etch stop layer is then deposited onto the substantially planar surface to form the planar etch stop layer.

At 526, a plurality of vias may be formed to provide for electrical connections to the metal layers of the MIM capacitor. The plurality of vias may be formed by performing a selective etching process to form openings vertically extending through the planar etch stop layer, the capacitor ILD layer, the MIM capacitor (e.g., the top capacitor metal layer, the bottom capacitor metal layer, etc.), and the buffer dielectric layer. A metal (e.g., copper, tungsten, aluminum, etc.) is then deposited within the openings to form the plurality of vias.

In some embodiments, forming the plurality of vias may comprise forming a first via configured to provide for a vertical connection to the bottom and top capacitor metal layers (at 528) and forming a second via configured to provide for an electrical connection to the middle capacitor metal layer (at 530). In other embodiments, the plurality of vias comprise a first via, a second via, and a third via, respectively configured to provide for an electrical connection to the bottom, middle, and top capacitor metal layers.

At 532, an upper metallization layer is formed within a metal inter-level dielectric (ILD) layer overlying the planar etch stop layer. In some embodiments, the upper metallization layer may comprise a metal wire layer comprising a conductive material configured to provide a lateral connection. In some embodiments, the upper metallization layer may be formed by performing a selective etching process to form trenches within the metal ILD layer and then depositing a metal (e.g., copper, aluminum, etc.) within the trenches in the metal ILD layer.

Therefore, the present disclosure relates to a MIM (metal-insulator-metal) capacitor, and an associated method of formation.

In some embodiments, the present disclosure relates to a MIM capacitor. The MIM capacitor comprises a first electrode having a bottom capacitor metal layer disposed over a semiconductor substrate. The MIM capacitor further comprises a second electrode having a middle capacitor metal layer overlying the bottom capacitor metal layer. The MIM capacitor further comprises a third electrode having a top capacitor metal layer comprising a stepped structure that is vertically and laterally separated from the middle capacitor metal layer by a capacitor dielectric layer that continuously extends from a first position between the bottom capacitor metal layer and the middle capacitor metal layer, to a second position between the middle capacitor metal layer and the top capacitor metal layer.

In other embodiments, the present disclosure relates to an integrated chip. The integrated chip comprises a MIM (metal-insulator-metal) capacitor disposed within a capacitor inter-level dielectric (ILD) layer, and comprising a first electrode comprising a bottom capacitor metal layer, a second electrode comprising a middle capacitor metal layer overlying the bottom capacitor metal layer, and a third electrode comprising a top capacitor metal layer comprising a stepped structure that is vertically and laterally separated from the middle capacitor metal layer by a capacitor dielectric layer that continuously extends from between the bottom capacitor metal layer and the middle capacitor metal layer, to between the middle capacitor metal layer and the top capacitor metal layer. The integrated chip further comprises a first via vertically extending through the capacitor ILD layer to a first position that electrically contacts the bottom capacitor metal layer and the top capacitor metal layer, and a second via vertically extending through the capacitor ILD layer to a second position that electrically contacts the middle capacitor metal layer and the top capacitor metal layer.

In yet other embodiments, the present disclosure relates to a method of forming a MIM capacitor. The method comprises forming a first electrode comprising a bottom capacitor metal layer, and forming a capacitor dielectric layer over the bottom capacitor metal layer. The method further comprises forming a second electrode comprising a middle capacitor metal layer separated from the bottom capacitor metal layer by the capacitor dielectric layer, and modifying the capacitor dielectric layer to extend over the middle capacitor metal layer. The method further comprises forming a third electrode comprising a top capacitor metal layer comprising a stepped structure that is vertically and laterally separated from the middle capacitor metal layer by the capacitor dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A MIM (metal-insulator-metal) capacitor, comprising:
a first electrode comprising a bottom capacitor metal layer disposed over a semiconductor substrate;
a second electrode comprising a middle capacitor metal layer overlying the bottom capacitor metal layer; and
a third electrode comprising a top capacitor metal layer comprising a stepped structure that is vertically and laterally separated from the middle capacitor metal layer by a capacitor dielectric layer that continuously extends from a first position between the bottom capacitor metal layer and the middle capacitor metal layer, to a second position between the middle capacitor metal layer and the top capacitor metal layer.

2. The MIM capacitor of claim 1, further comprising:
a dielectric buffer layer disposed below the bottom capacitor metal layer; and
an under-metal layer separated from the bottom capacitor metal layer by the dielectric buffer layer, wherein the under-metal layer comprises one or more metal structures located under the bottom capacitor metal layer.

3. The MIM capacitor of claim 2,
wherein the capacitor dielectric layer may branches out from a main branch abutting the dielectric buffer layer to a lower branch and an upper branch; and
wherein the lower branch is disposed between the bottom capacitor metal layer and the middle capacitor metal layer, and wherein the upper branch is disposed between the middle capacitor metal layer and the top capacitor metal layer.

4. The MIM capacitor of claim 1, wherein the capacitor dielectric layer has a thickness that varies from a first thickness between the bottom capacitor metal layer and the top capacitor metal layer to a second thickness between the bottom capacitor metal layer and the middle capacitor metal layer, and to a third thickness between the middle capacitor metal layer and the top capacitor metal layer.

5. The MIM capacitor of claim 1, further comprising:
a capacitor inter-level dielectric (ILD) layer disposed over the top capacitor metal layer; and
a substantially planar second etch stop layer disposed over the capacitor ILD layer.

6. The MIM capacitor of claim 5, further comprising:
a first via vertically extending through the capacitor ILD layer to a first position that electrically contacts the bottom capacitor metal layer;
a second via vertically extending through the capacitor ILD layer to a second position that electrically contacts the middle capacitor metal layer; and
a third via vertically extending through the capacitor ILD layer to a third position that electrically contacts the top capacitor metal layer.

7. The MIM capacitor of claim 1, wherein the bottom capacitor metal layer, the middle capacitor metal layer, and the top capacitor metal layer have a thickness that is between approximately 100 angstrom and approximately 800 angstrom.

8. The MIM capacitor of claim 1, further comprising:
a capacitor etch stop layer extending laterally from over the top capacitor metal layer over the bottom capacitor metal layer.

9. The MIM capacitor of claim 8, further comprising a cap layer having a first side abutting the top capacitor metal layer and the dielectric layer, and having an opposing second side abutting the capacitor etch stop layer.

10. A method of forming a MIM capacitor, comprising:
forming a first electrode comprising a bottom capacitor metal layer;
forming a capacitor dielectric layer over the bottom capacitor metal layer;
forming a second electrode comprising a middle capacitor metal layer separated from the bottom capacitor metal layer by the capacitor dielectric layer;
modifying the capacitor dielectric layer to extend over the middle capacitor metal layer; and
forming a third electrode comprising a top capacitor metal layer comprising a stepped structure that is vertically and laterally separated from the middle capacitor metal layer by the capacitor dielectric layer.

11. A MIM capacitor, comprising:
a bottom capacitor metal layer disposed over a semiconductor substrate;
a middle capacitor metal layer overlying the bottom capacitor metal layer;
a top capacitor metal layer overlying the middle capacitor metal layer;
a capacitor dielectric layer having a first lateral segment vertically arranged between the bottom capacitor metal layer and the middle capacitor metal layer, a second lateral segment vertically arranged between the middle capacitor metal layer and the top capacitor metal layer, and a vertical segment connected to the first lateral segment and the second lateral segment and laterally arranged between the middle capacitor metal layer and the top capacitor metal layer; and
a capacitor inter-level dielectric (ILD) layer overlying the bottom capacitor metal layer, the middle capacitor metal layer, and the top capacitor metal layer.

12. The MIM capacitor of claim 11, wherein the top capacitor metal layer has a first sidewall that is laterally set back from a sidewall of the middle capacitor metal layer.

13. The MIM capacitor of claim 11, wherein the top capacitor metal layer has a second sidewall that is laterally aligned with a sidewall of the capacitor dielectric layer.

14. The MIM capacitor of claim 11, wherein the top capacitor metal layer comprises a stepped structure that is vertically and laterally separated from the middle capacitor metal layer by the capacitor dielectric layer.

15. The MIM capacitor of claim 11, further comprising:
a substantially planar etch stop layer vertically arranged between the capacitor ILD layer and a metal ILD layer overlying the capacitor ILD layer.

16. The MIM capacitor of claim 11, wherein the bottom capacitor metal layer is vertically separated from an underlying metal layer by a dielectric buffer layer.

17. The MIM capacitor of claim 16, wherein the dielectric buffer layer and the capacitor ILD layer are a same material.

18. The MIM capacitor of claim 11, further comprising:
a plurality of conductive vias vertically extending from an upper surface of the capacitor ILD layer to the bottom capacitor metal layer, the middle capacitor metal layer, and the top capacitor metal layer.

19. The MIM capacitor of claim 11, further comprising:
a cap layer in direct contact with an upper surface of the top capacitor metal layer and a sidewall of middle capacitor metal layer.

20. The MIM capacitor of claim 19, wherein the cap layer is in direct contact with the upper surface of the top capacitor metal layer and the second lateral segment of the capacitor dielectric layer.

* * * * *